US007659822B2

(12) United States Patent
Carrender et al.

(10) Patent No.: US 7,659,822 B2
(45) Date of Patent: Feb. 9, 2010

(54) METHOD AND APPARATUS FOR TESTING RFID DEVICES

(75) Inventors: Curtis Lee Carrender, Morgan Hill, CA (US); Mark A. Hadley, Newark, CA (US)

(73) Assignee: Alien Technology Corporation, Morgan Hill, CA (US)

( * ) Notice: Subject to any disclaimer, the term of this patent is extended or adjusted under 35 U.S.C. 154(b) by 0 days.

(21) Appl. No.: 12/022,933

(22) Filed: Jan. 30, 2008

(65) Prior Publication Data
US 2008/0204244 A1 Aug. 28, 2008

Related U.S. Application Data

(63) Continuation of application No. 11/929,632, filed on Oct. 30, 2007, which is a continuation of application No. 11/127,697, filed on May 11, 2005, now Pat. No. 7,301,458.

(51) Int. Cl.
G08B 13/14 (2006.01)
G06K 7/00 (2006.01)

(52) U.S. Cl. .................. 340/572.1; 340/572.4; 235/438

(58) Field of Classification Search ............. 340/572.1, 340/572.4, 572.7; 324/667; 235/492, 437, 235/436, 438
See application file for complete search history.

(56) References Cited

U.S. PATENT DOCUMENTS

| | | | |
|---|---|---|---|
| 6,104,291 A | 8/2000 | Beauvillier et al. | |
| 6,487,681 B1 | 11/2002 | Tuttle et al. | |
| 6,657,289 B1 | 12/2003 | Craig et al. | |
| 6,683,663 B1 | 1/2004 | Hadley et al. | |
| 6,816,380 B2 | 11/2004 | Credelle et al. | |
| 6,850,312 B2 | 2/2005 | Jacobsen et al. | |
| 6,864,435 B2 | 3/2005 | Hermanns et al. | |
| 6,951,596 B2 | 10/2005 | Green et al. | |
| 7,164,353 B2 * | 1/2007 | Puleston et al. | ............. 340/514 |
| 7,187,293 B2 | 3/2007 | White | |
| 7,214,569 B2 | 5/2007 | Swindlehurst et al. | |
| 7,292,148 B2 | 11/2007 | Forster | |
| 7,295,117 B2 | 11/2007 | Forster et al. | |
| 7,298,266 B2 | 11/2007 | Forster | |
| 7,298,267 B2 | 11/2007 | Forster | |
| 7,307,527 B2 | 12/2007 | Forster | |

(Continued)

FOREIGN PATENT DOCUMENTS

WO    WO 2006/066938 A1    6/2006

OTHER PUBLICATIONS

PCT Notification of the International Search Report and The Written Opinion of the International Searching Authority, or the Declaration, for PCT/US2006/016898, and the Written Opinion, date of mailing Sep. 19, 2006 (11 pages).

(Continued)

*Primary Examiner*—Toan N Pham
(74) *Attorney, Agent, or Firm*—Blakely, Sokoloff, Taylor & Zafman LLP

(57) ABSTRACT

A method and apparatus for testing RFID straps. Arrays of RFID straps in a roll-to-roll process are coupled to an array of test elements. RF programming and interrogation signals are frequency and time multiplexed to the RFID array. Return signals are detected to determine sensitivity and programmability parameters of the RFID straps.

45 Claims, 14 Drawing Sheets

U.S. PATENT DOCUMENTS

| | | | |
|---|---|---|---|
| 7,359,823 B2 | 4/2008 | Forster | |
| 7,361,251 B2 | 4/2008 | Green et al. | |
| 7,368,032 B2 | 5/2008 | Green et al. | |
| 2002/0167397 A1 | 11/2002 | Eroglu et al. | |
| 2002/0186004 A1 | 12/2002 | Prazeres da Costa et al. | |
| 2004/0160233 A1 | 8/2004 | Forster | |
| 2005/0223286 A1 | 10/2005 | Forster | |
| 2006/0226982 A1 | 10/2006 | Forster | |
| 2007/0018831 A1* | 1/2007 | Shanton | 340/572.7 |

OTHER PUBLICATIONS

Alien Product Schematic, "Strap, RFID, Meson, Sheet", 9700020-001 Rev: A, Oct. 30, 2003, 4 pages.

U.S. Appl. No. 60/601,991, "Singulation of RFID Tags for Testing and/or Programming", Joe White, et al., filed Aug. 17, 2004, pp. 1-12.

* cited by examiner

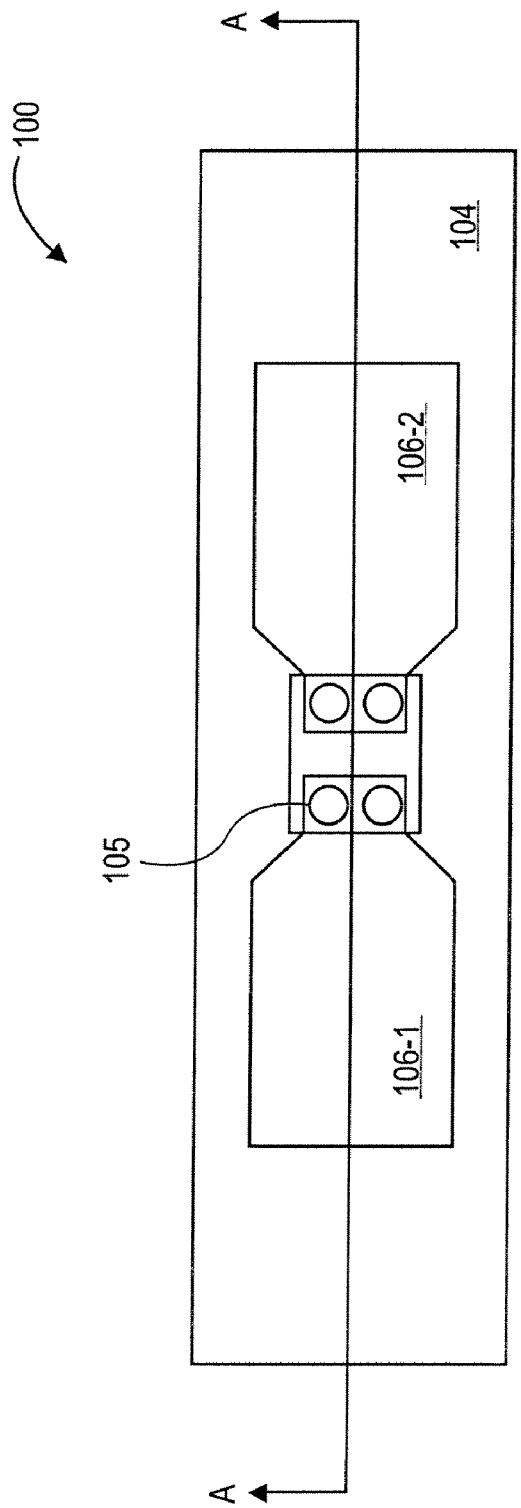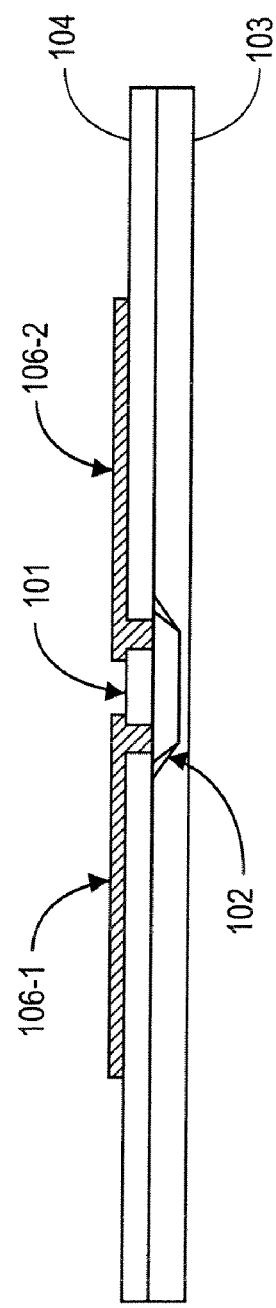
FIG. 1A
FIG. 1B
(SECTION A-A)

WEB DIRECTION (SECTION B-B)

(SECTION C-C)

| COLUMN | 1 | 2 | 3 | 4 | 5 | 6 | | m-1 | m |
|---|---|---|---|---|---|---|---|---|---|
| FREQUENCY | f1 | f2 | f3 | f4 | f5 | f6 | | fm-1 | fm |

| | | | | | | | | |
|---|---|---|---|---|---|---|---|---|
| 1 | n/2+1 | 1 | n/2+1 | 1 | n/2+1 | | 1 | n/2+1 |
| 2 | n/2+2 | 2 | n/2+2 | 2 | n/2+2 | | 2 | n/2+2 |
| 3 | n/2+3 | 3 | n/2+3 | 3 | n/2+3 | ..... | 3 | n/2+3 |
| 4 | n/2+4 | 4 | n/2+4 | 4 | n/2+4 | | 4 | n/2+4 |

| n/2-1 | n-1 | n/2-1 | n-1 | n/2-1 | n-1 | | n/2-1 | n-1 |
|---|---|---|---|---|---|---|---|---|
| n/2 | n | n/2 | n | n/2 | n | | n/2 | n |
| n/2+1 | 1 | n/2+1 | 1 | n/2+1 | 1 | ..... | n/2+1 | 1 |
| n/2+2 | 2 | n/2+2 | 2 | n/2+2 | 2 | | n/2+2 | 2 |

| n-3 | n/2-3 | n-3 | n/2-3 | n-3 | n/2-3 | | n-3 | n/2-3 |
|---|---|---|---|---|---|---|---|---|
| n-2 | n/2-2 | n-2 | n/2-2 | n-2 | n/2-2 | | n-2 | n/2-2 |
| n-1 | n/2-1 | n-1 | n/2-1 | n-1 | n/2-1 | ..... | n-1 | n/2-1 |
| n | n/2 | n | n/2 | n | n/2 | | n | n/2 |

FIG. 12

| COLUMN NUMBER | CHANNEL | DELTA TO NEAREST NEIGHBOR | DELTA TO 2ND NEAREST NEIGHBOR |
|---|---|---|---|
| 1 | 7 | 46 | 28 |
| 2 | 53 | 18 | 42 |
| 3 | 35 | 18 | 14 |
| 4 | 11 | 24 | 21 |
| 5 | 49 | 17 | 14 |
| 6 | 32 | 17 | 14 |
| 7 | 14 | 18 | 14 |
| 8 | 46 | 18 | 14 |
| 9 | 28 | 18 | 14 |
| 10 | 60 | 18 | 14 |
| 11 | 42 | 18 | 14 |
| 12 | 18 | 24 | 21 |
| 13 | 63 | 24 | 21 |
| 14 | 39 | 18 | 21 |
| 15 | 21 | 17 | 35 |
| 16 | 4 | 17 | 21 |
| 17 | 56 | 31 | 35 |
| 18 | 25 | 25 | 21 |
| 19 | 0 | 25 | 56 |

FIG. 13

METHOD AND APPARATUS FOR TESTING RFID DEVICES

RELATED APPLICATIONS

This application is a continuation of and claims priority from co-pending U.S. patent application Ser. No. 11/929,632 filed on Oct. 30, 2007, which is a continuation application of and claims priority from U.S. patent application Ser. No. 11/127,697, filed May 11, 2005, which issued as U.S. Pat. No. 7,301,458, on Nov. 27, 2007, and which is herein incorporated by reference in its entirety.

GOVERNMENT RIGHTS NOTICE

This invention was made with U.S. Government support under Contract No. H94003-04-2-0406. The U.S. Government has certain rights to this invention.

TECHNICAL FIELD

Embodiments of the invention relate to the field of radio frequency identification (RFID) systems and, in particular, to testing RFID devices.

BACKGROUND

Radio frequency identification (RFID) devices are used in the form of RFID labels or RFID tags to associate objects with an identification code that may be read or programmed at a distance by stimulating the RFID device with a radio frequency (RF) interrogation or programming signal. Typically, an RFID device consists of an active or passive semiconductor chip assembled with an antenna to receive RF energy from a reader and to transmit or reflect RF energy to the reader in response to an interrogation or programming signal.

High volume manufacturing methods and systems have been developed to produce RFID devices. One system, developed by Alien Technology Corporation of Morgan Hill, Calif., and described in U.S. Pat. No. 6,683,663, utilizes a fluidic self-assembly (FSA) process to deposit RFID chips in a flexible plastic web substrate material having recessed regions to hold the RFID chips. In subsequent operations, a flexible plastic tape material is bonded to the web material to capture the RFID chips, holes are opened over small electrical contact areas on the chips and larger electrical contacts, suitable for attaching an antenna, are screen-printed on the tape material. Each RFID chip with its associated electrical contacts on the flexible substrate assembly is referred to as an interposer, or alternatively as an RFID strap.

FIG. 1A illustrates one example of an RFID strap 100 and FIG. 1B shows a cross-section through RFID strap 100. RFID chip 101 is deposited in recess 102 of web material 103. The RFID chip is laminated between web material 103 and tape 104. Holes 105 are formed through tape 104, and two electrical contacts 106-1 and 106-2 are deposited through holes 105 and on the surface of tape 104. FIG. 2 illustrates an array of RFID straps 200 on a segment of the web material. In practice, RFID straps are manufactured in large continuous arrays in a roll-to-roll process that produces many thousands of straps.

In conventional RFID manufacturing systems, the RFID straps are diced from the web array, and assembled with antennas to form a complete RFID device, before any functional RF testing is performed. At this point in the manufacturing process, an assembled RFID device may fail functional testing if the antenna connection is poor or if the RFID chip is defective. If the cause of failure is a defective RFID chip that could have been identified before the final assembly step, then the time and cost associated with the antenna assembly process is wasted.

SUMMARY OF THE DESCRIPTION

A method and apparatus for testing RFID straps is described. In one embodiment, the method includes coupling an array of RFID straps to an RFID tester, multiplexing a number of test signals to the array to test the RFID straps to prevent crosstalk among the RFID straps, and detecting return signals from the RFID straps.

In another embodiment, an array of paired test elements is arranged in a number of columns. Each column of paired test elements is coupled through a switching matrix with an RFID reader capable of transmitting and receiving RFID test signals. A compression plate is configured to compress an array of RFID straps having paired contacts against the array of paired test elements. The RFID test signals are multiplexed in frequency to the columns of paired test elements and multiplexed in time to the paired test elements in each column.

In one embodiment, the array of paired test elements is directly coupled with the paired contacts in the array of RFID straps. In another embodiment, the array of paired test elements is capacitively coupled with the paired contacts in the array of RFID straps.

BRIEF DESCRIPTION OF THE DRAWINGS

The present invention is illustrated by way of example, and not of limitation, in the figures of the accompanying drawings in which:

FIG. 1A illustrates a conventional RFID strap;

FIG. 1B illustrates a cross-section of a conventional RFID strap;

FIG. 12 illustrates one embodiment of time-division multiplexing;

FIG. 13 illustrates one embodiment of frequency-division multiplexing; and

DETAILED DESCRIPTION

Figure 2:
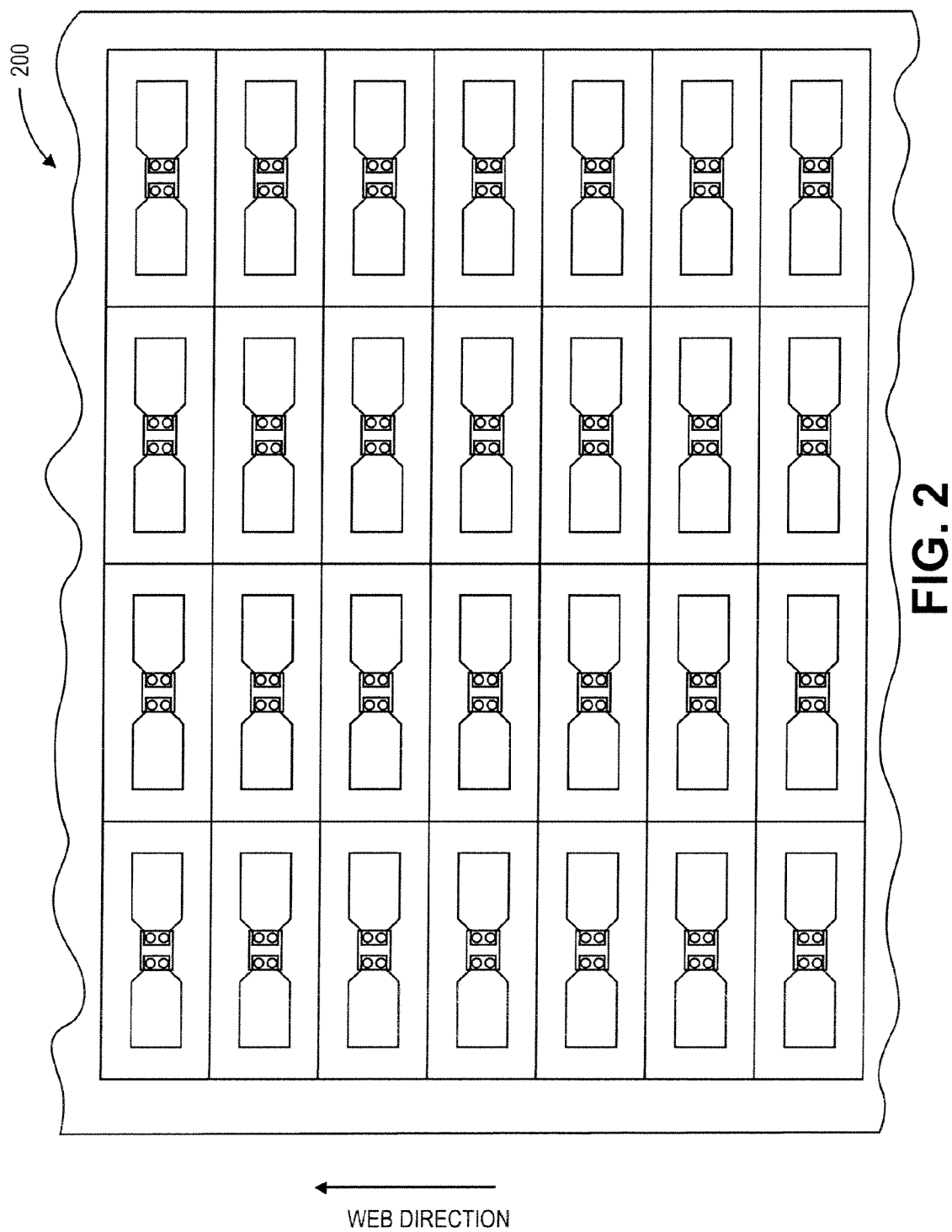
FIG. 2 illustrates a conventional array of RFID straps.
Figure 3:
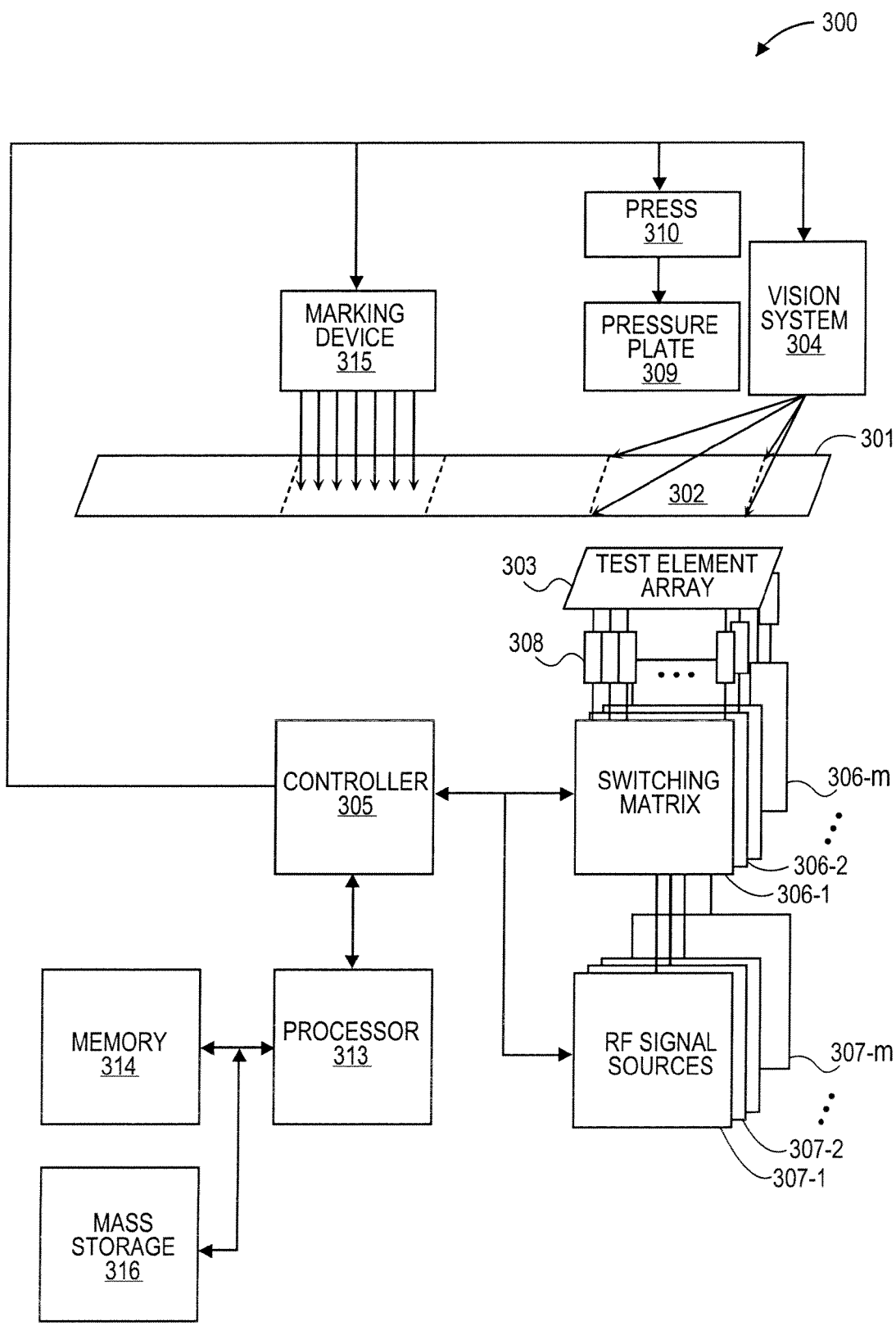
FIG. 3 illustrates one embodiment of a system for testing RFID straps.

FIG. 3 illustrates a test system 300 according to one embodiment of the invention. In FIG. 3, a continuous roll of web material 301 contains arrays of RFID straps arranged as frames 302 of m columns and n rows of RFID devices. A system of rollers, guides and motors (not shown) may be used in a conventional manner to transport the web material 301 across an m by n array of test elements 303. As described in detail below, the test element array 303 may be an array of printed elements on a printed circuit card, which may allow the array of RFID straps to be either directly coupled to the array of test elements 303, or capacitively coupled to the array of test elements 303. Alternatively, the array of test elements 303 may be an array of spring-loaded contact pins, in which case the array of RFID straps may be directly coupled to the array of test elements 303.

Each of the m columns of n test elements in test element array 303 may be connected to one of m switching matrices 306-1 through 306-m. Each of the m switching matrices maybe a 1-port×n-port switching matrix which may be capable of switching an RF test signal from one of m RF signal sources 307-1 through 307-m, to any of the n test elements in the corresponding column of the test element array 303. In one embodiment, signal sources 307-1 through 307-m may be RFID readers or transceivers configured to operate at m different frequency channels within an RFID band. In one embodiment, described in greater detail below, an impedance matching network, such as matching network 308 may be located between each element in the array of test elements 303 and a corresponding port on one of switching matrices 306-1 through 306-m.

Figure 4:
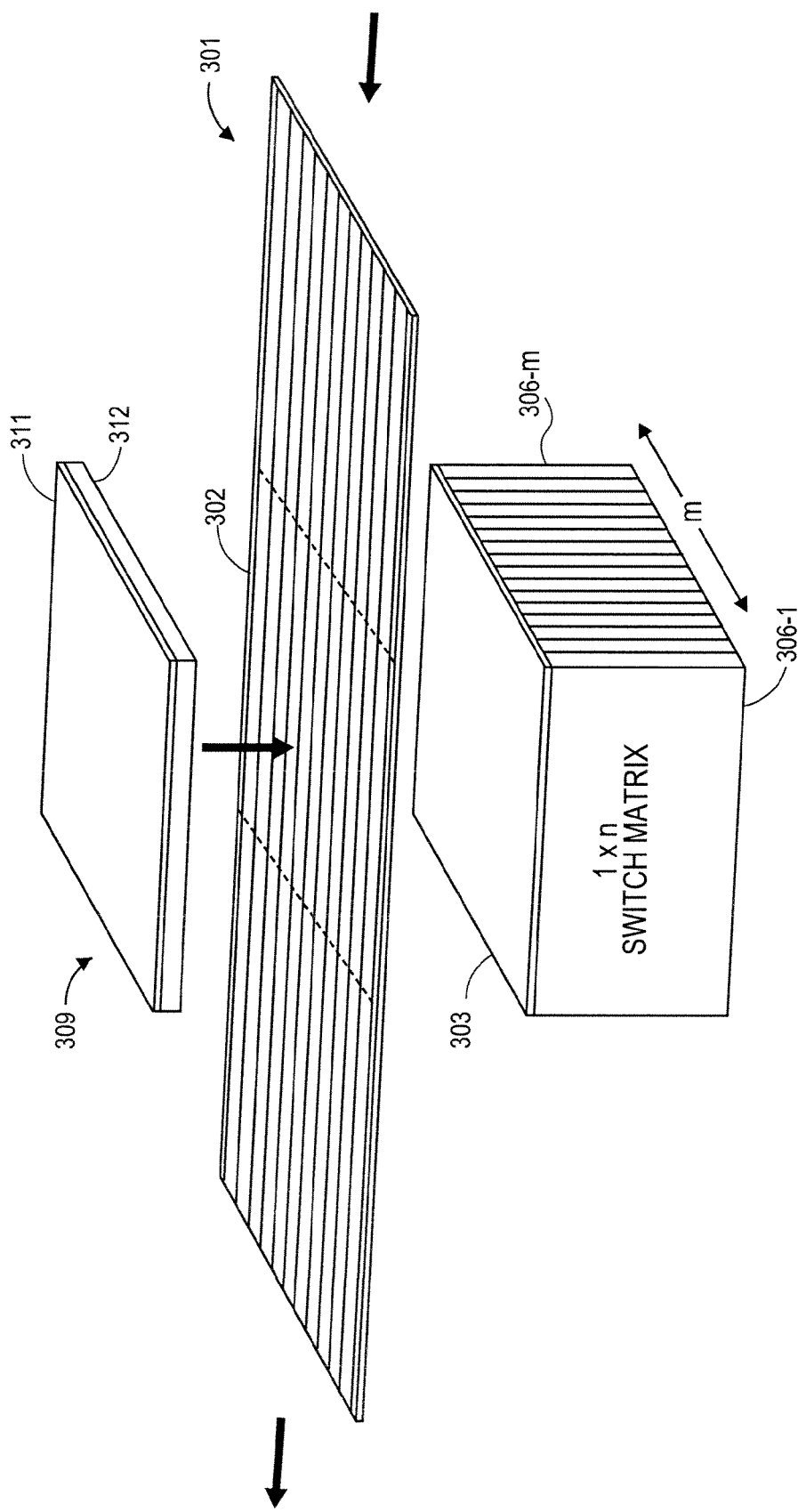
FIG. 4 illustrates another embodiment of a system for testing RFID straps.

A machine-vision system, 304 controlled by a controller 305, may be used to align the frames of RFID devices with the array of test elements 303 by matching alignment marks on the edges of the web material 301 with one or more fiducial markers on the test element array 303 in a conventional manner. After a frame 302 of RFID straps is aligned with the array of test elements 303, the frame of RFID straps 302 may be coupled to the array of test elements 303 by compressing the web material against the array of test elements 303 with a pressure plate 309. The pressure plate 309 may be operated by a press device 310 under the control of controller 305. As illustrated in FIG. 4, pressure plate 309 may have a rigid top plate 311 and a compressible bottom surface 312 to apply uniform pressure to the frame of RFID straps 302 without damaging the RFID straps. Bottom surface 312 may be any compressible material or structure such as, for example, a foam pad or an inflated bladder.

Figure 5:
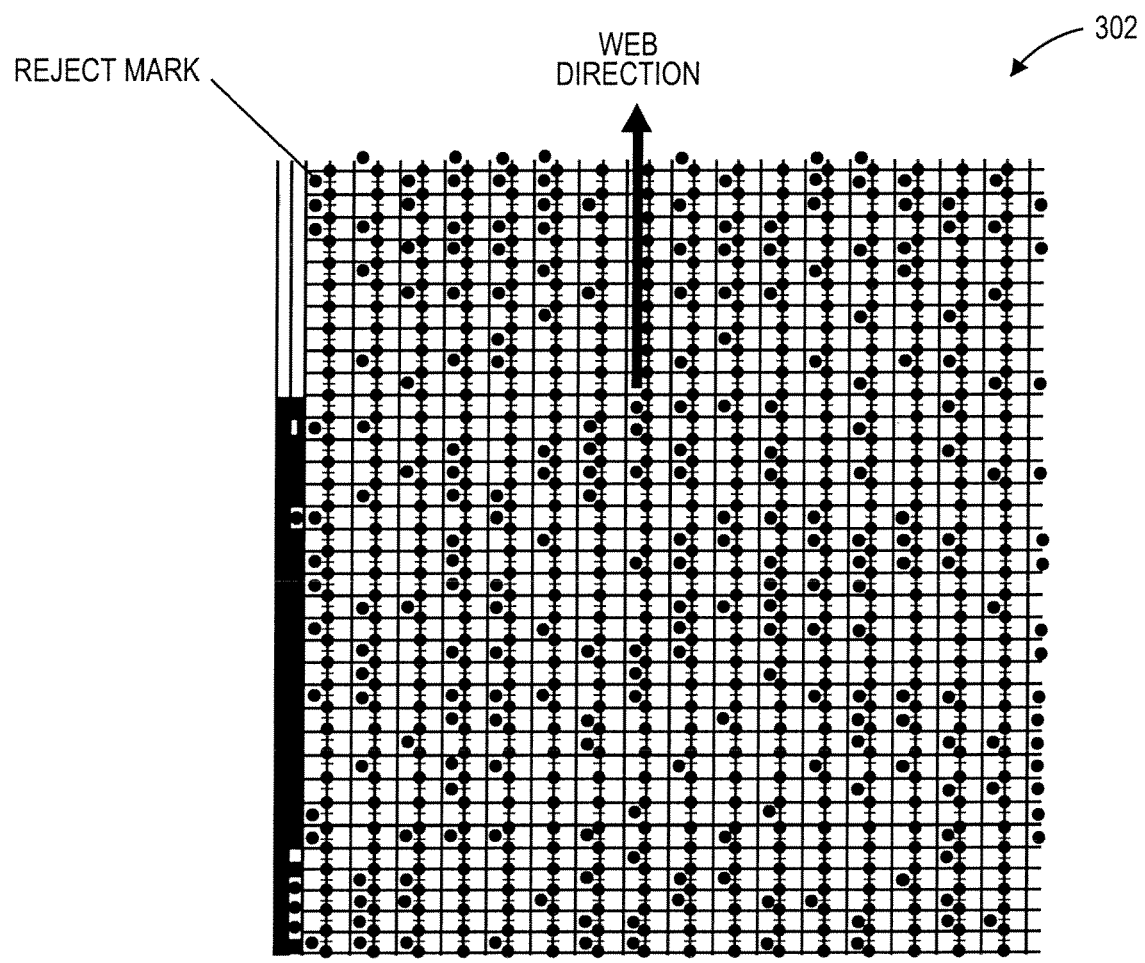
FIG. 5 illustrates marking RFID straps in one embodiment of testing RFID straps.

When the frame of RFID straps 302 has been coupled with the test element array 303, RF signals generated by RF signal sources 307-1 through 307-m may be used to program and/or test all of the RFID straps in the frame 302 for sensitivity as described in greater detail below. The test program may be an automated test process managed by a test program executing on a processor 313, which may be any general-purpose or special purpose data processing device. Test results for each RFID strap, and its location in the frame, may be stored in a memory system or device 314 coupled to processor 313, which may be any type of non-volatile memory system or device. System 300 may also include a mass storage device, such as mass storage 316 to retain data, programs, instructions and the like. Pass-fail test results and frame locations for each RFID strap in frame 302 may be transmitted to a marking device 315 that may be used to mark RFID straps that fail sensitivity or programming tests. FIG. 5 illustrates marking failed RFID straps in frame 302 with reject marks. Marking device 315 may be, for example, and inking marker or a laser marker as is known in the art.

Figure 6A:
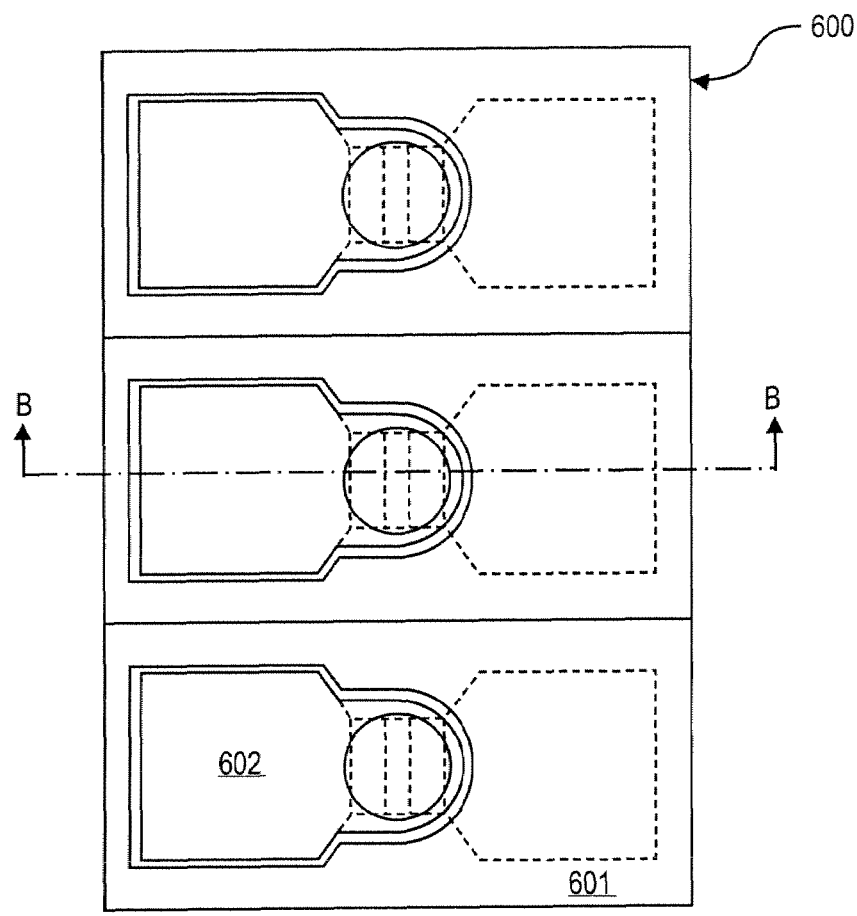
FIG. 6A illustrates one embodiment of a test element.
Figure 6B:
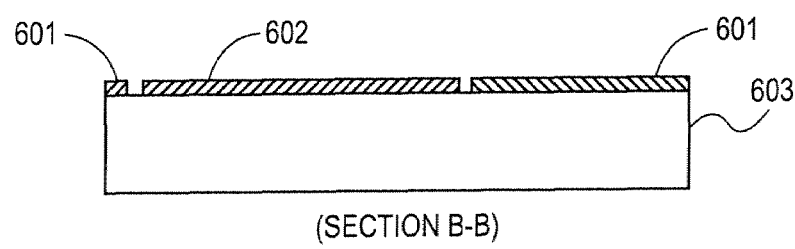
FIG. 6B illustrates a sectional view of FIG. 6A.
Figure 6C:
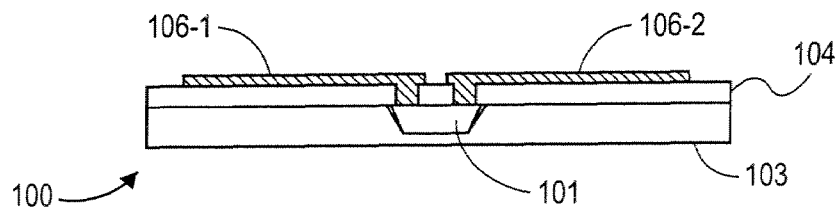
FIG. 6C illustrates a conventional RFID strap which may be tested with the embodiment of FIG. 6A.

As noted above, lest element array 303 may be a printed array of test elements on a printed circuit card. FIG. 6A illustrates a section of three test element cells 600 from a test element array 303 in one embodiment of the invention. A cross section through one of the test element cells is illustrated in FIG. 6B. A cross section of the RFID strap 100 is shown in FIG. 6C and a partial outline of the RFID strap 100 is shown in FIG. 6A (dotted lines) to illustrate the relationship of the test element cell 600 to the RFID strap 100.

As illustrated in FIGS. 6A and 6B, each cell may include a pair of test elements, a ground plane metallization 601 and a signal metallization 602, on a printed circuit card 603. In one embodiment, the ground plane metallization 601 may be connected to the outer conductor of a coaxial transmission line or connector that connects the test element array 303 with a port on one of the switching matrices 306-1 through 306-m. The signal metallization may be connected to the inner conductor of the coaxial transmission line or connector. Coaxial-to-planar interconnect methods are known in the art and will not be described in detail, herein.

Figure 7A:
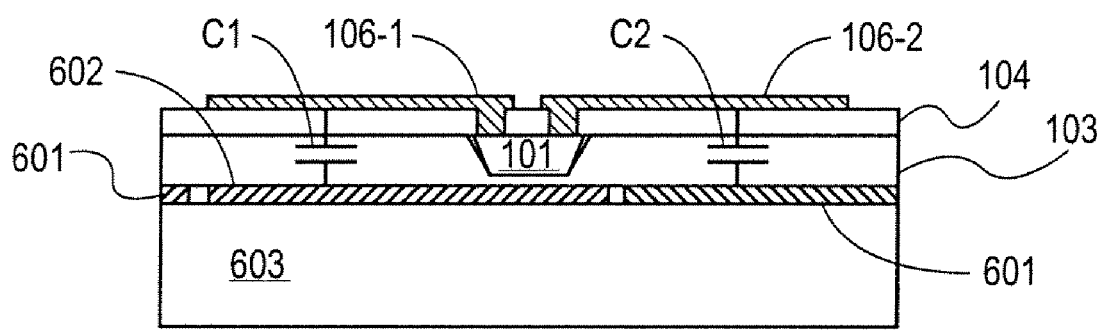
FIG. 7A illustrates a sectional view in one embodiment of coupling between the test element of FIG. 6B and a conventional RFID strap.
Figure 7B:
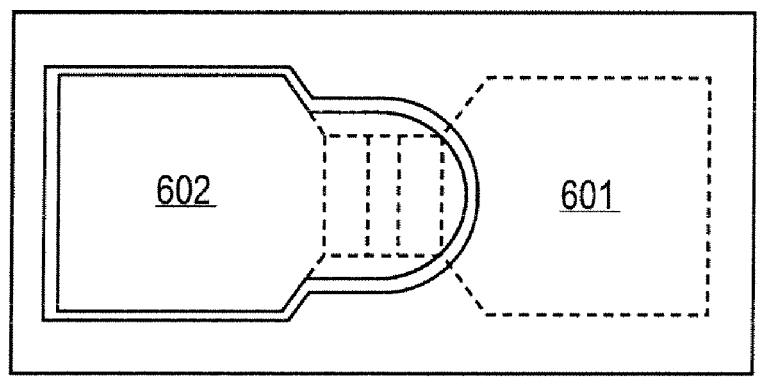
FIG. 7B illustrates a plane view of FIG. 7A.

In one embodiment, illustrated in FIGS. 7A and 7B, the RFID strap 100 may be capacitively coupled to the test element cell 600 as indicated by the equivalent coupling capacitors C1 and C2 with the web layers 103 and 104 providing an insulating dielectric layer. Ground metallization 601 couples to electrical contact 106-2 and signal metallization 602 couples to electrical contact 106-1. This embodiment provides non-symmetrical coupling to RFID strap 100. Capacitance C1 is greater than capacitance C2 because signal metallization 602 overlaps the RFID chip 101 and partially couples to electrical contact 106-2. The coupling imbalance may be small if the RFID chip is electrically and functionally symmetrical. In some fluidic self-assembly processes, however, the geometry of the RFID chip 101 may allow it to be captured in the flexible substrate material 103 in two different orientations which may be physically indistinguishable but which are functionally asymmetric. For example, the RFID chip 101 may have a ground contact and signal contact which may randomly be aligned and connected with electrical contact 106-1 and 106-2. In that case, approximately half of the RFID chips in a frame will have their signal contacts coupled to the ground metallization of the test cell, and the other half will have their signal contacts coupled to the signal metallization of the test cell. If the chip orientation is random, it will not be possible to separate RFID chip performance and chip orientation.

Figure 8A:
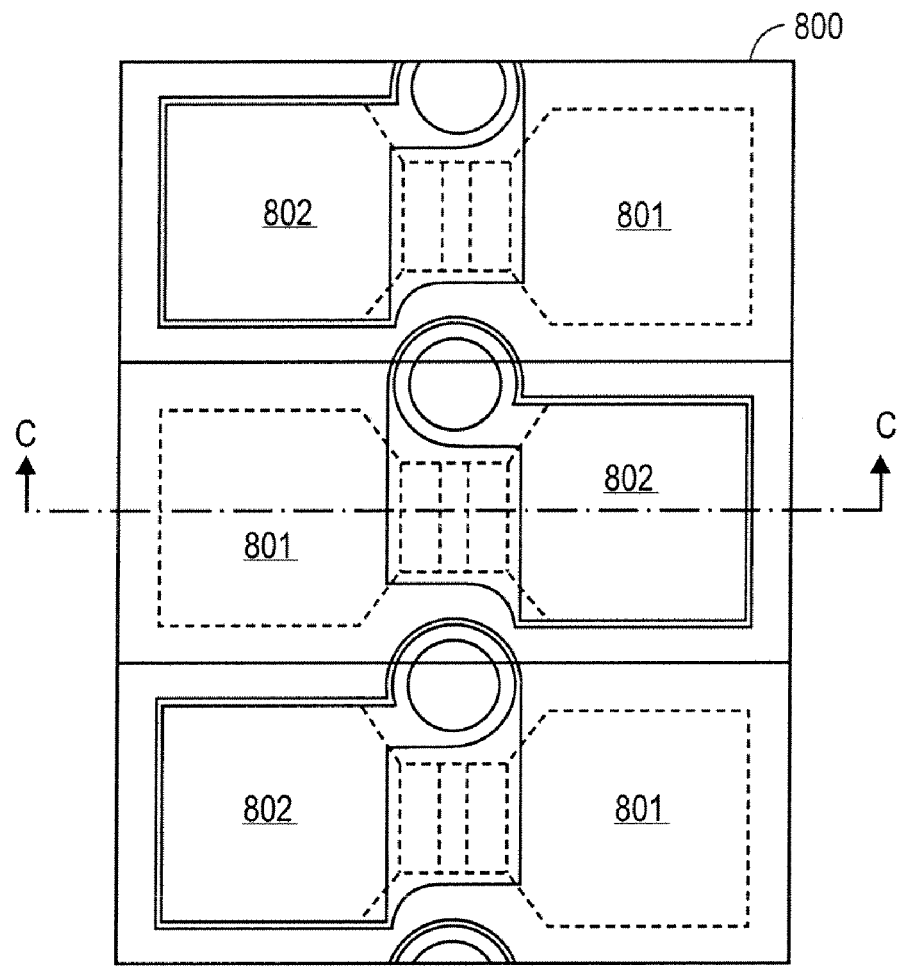
FIG. 8A illustrates a plane view of another embodiment of a test element.
Figure 8B:
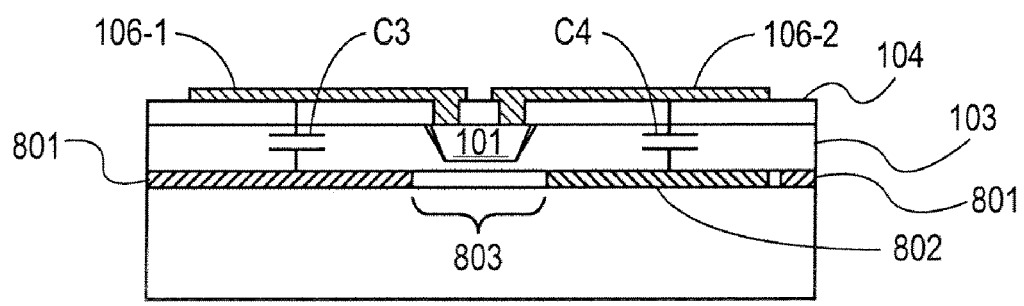
FIG. 8B illustrates a sectional view of the test element of FIG. 8A coupled with a conventional RFID strap in one embodiment.

FIGS. 8A and 8B illustrate an alternative embodiment of a test cell geometry that provides symmetrical coupling that is independent of RFID chip orientation. FIG. 8A illustrates a section of three test cells 800, superimposed over outlines of RFID strap 100, where each cell includes a pair of test elements; a ground plane metallization 801 and a signal metallization 802. FIG. 8B illustrates the capacitive coupling between the RFID and the test cell when the unmetallized surface of the web material 103 is compressed against the test elements 801 and 802. Equivalent capacitances C3 and C4 substantially equal because the area of the parallel plate capacitor C3, formed by electrical contact 106-1 and metallization 802, is substantially the same as the area of the parallel plate capacitor C4, formed by electrical contact 106-2 and metallization 801. Furthermore, because there is no metallization in window 803, under RFID chip 101, the coupling between RFID strap 100 and the test cell will be substantially independent of RFID chip orientation.

Figure 9:
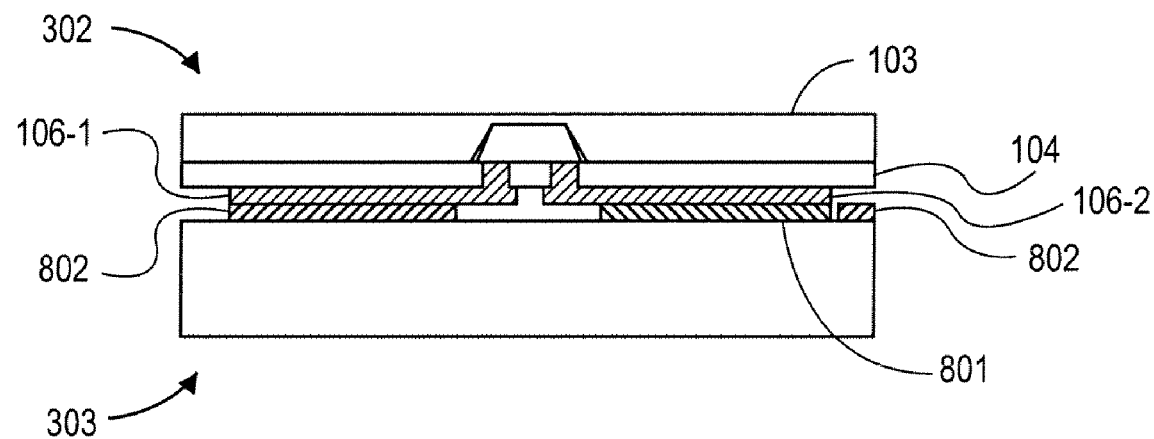
FIG. 9 illustrates a sectional view of the test element of FIG. 8A coupled with a conventional RFID strap in another embodiment.
Figure 10A:
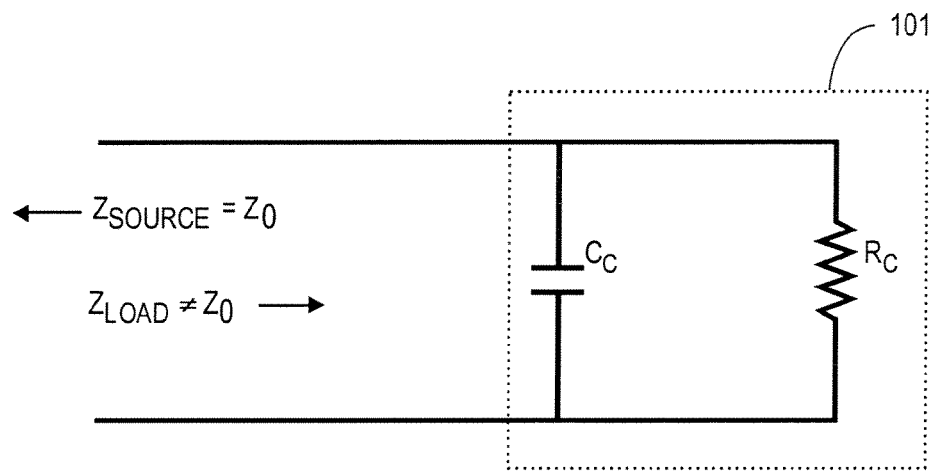
FIG. 10A illustrates an equivalent circuit of an RFID strap in one embodiment of testing RFID straps.

In one embodiment, as illustrated in FIG. 9, the orientation of web material 301 may be selected such that the metallized side 104 of the array of RFID straps 302 is compressed against test element array 303 and there is a direct electrical coupling between the test element array 303 and the array of RFID straps 302 as illustrated in FIG. 9 by the direct contact of paired electrical contacts 106-1 and 106-2 with paired test elements 802 and 801, respectively. FIG. 10A illustrates an equivalent circuit of the direct contact configuration of FIG. 9. In FIG. 10A, a parallel equivalent circuit of RFID chip 101 is represented by capacitor Cp and resistor Rp. In one embodiment, capacitor Cp may have a value of approximately 0.85 picofarad and resistor Rp may have a value of approximately 2600 Ohms. Each of RF signal sources 307-1 through 307-m may have a source impedance $Z_0$ of 50 Ohms. It will be appreciated that there may be a significant mismatch between the impedance of the RFID chip and the source impedance of the RF signal source such that a substantial portion of the power available from the RF signal source may not be coupled to the RFID chip.

Figure 10B:
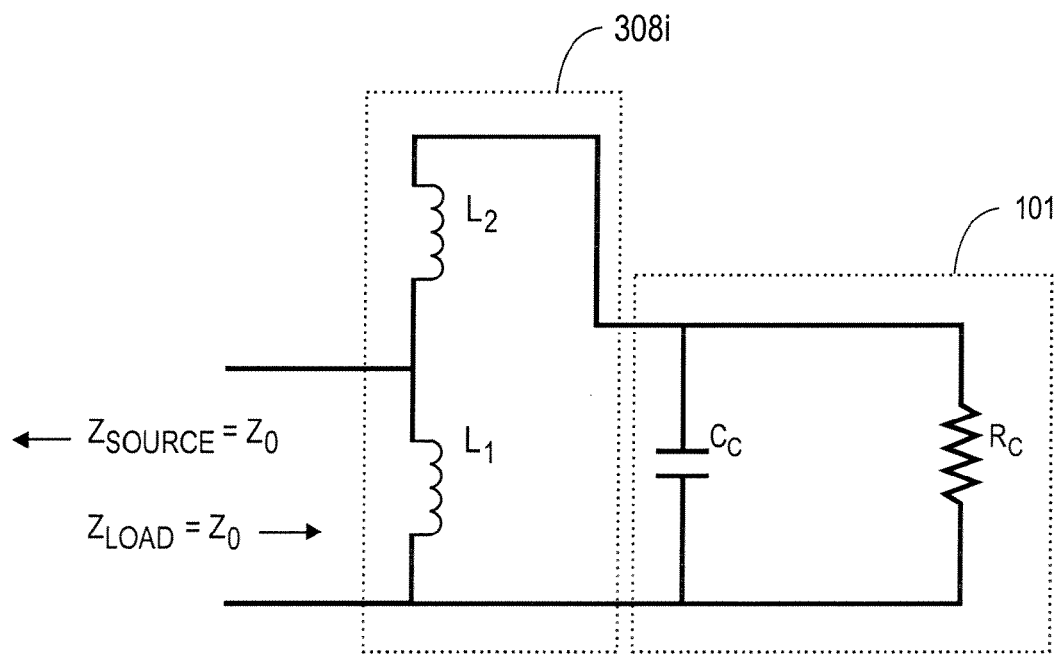
FIG. 10B illustrates one embodiment of impedance matching to an RFID strap.

As noted above, a matching network 308 may be inserted between each element in the array of test elements 303 and a corresponding port on one of switching matrices 306-1 through 306-m. FIG. 10B illustrates a one embodiment of a matching network 308 consisting of inductors L1 and L2 configured as an autotransformer. The values of inductors L1 and L2 may be chosen such that (L1+L2) resonates with Cp at the operating frequency $f_0$ of the RFID chip, and $[(L1+L2)/L1]^2 = Rp/Z0$. That is, L1 and L2 may be chosen to satisfy the two equations:

$$(L_1+L_2)=[(2\pi f_0)^2 C_P]^{-1} \quad (1)$$

and $$[(L_1+L_2)/L_1]^2 = R_P/Z_0 \quad (2)$$

In one embodiment, for example, the operating frequency of the RFID chip may be 915 MHz, in which case solving equations (1) and (2) yields values for L1 and L2 of approximately 6 nanohenries and 31 nanohenries, respectively.

Figure 11A:
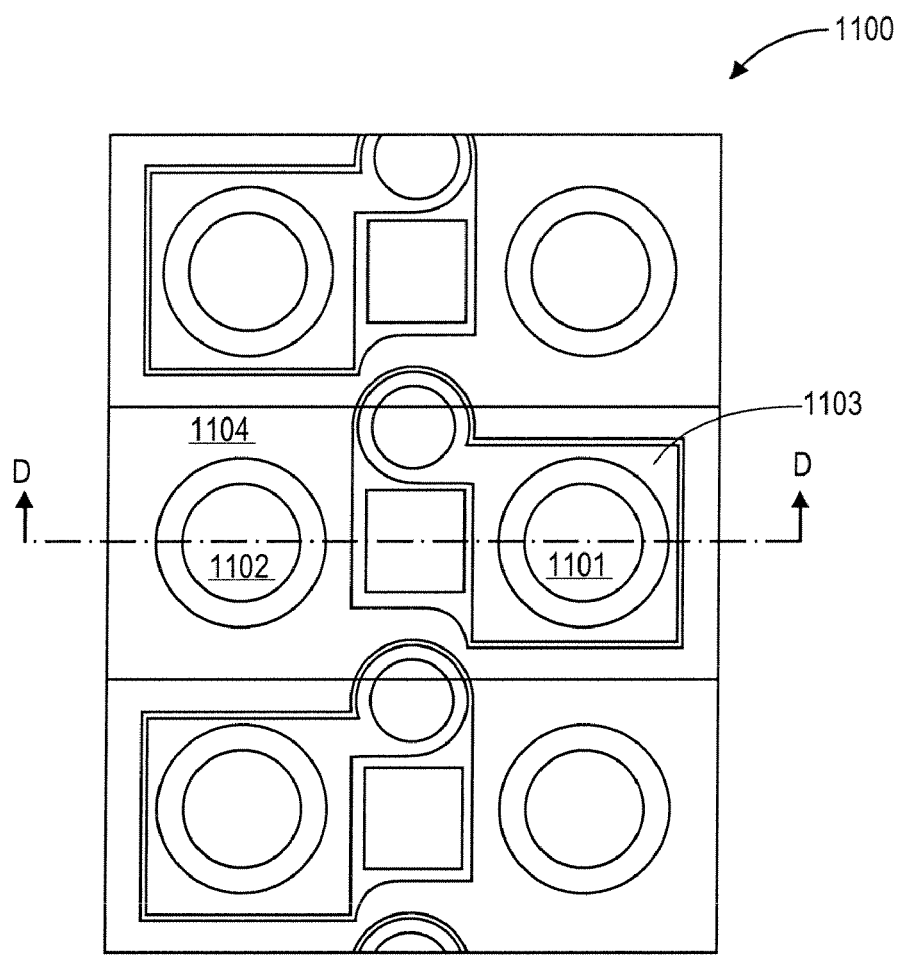
FIG. 11A illustrates a plane view of another embodiment of a test element.
Figure 11B:
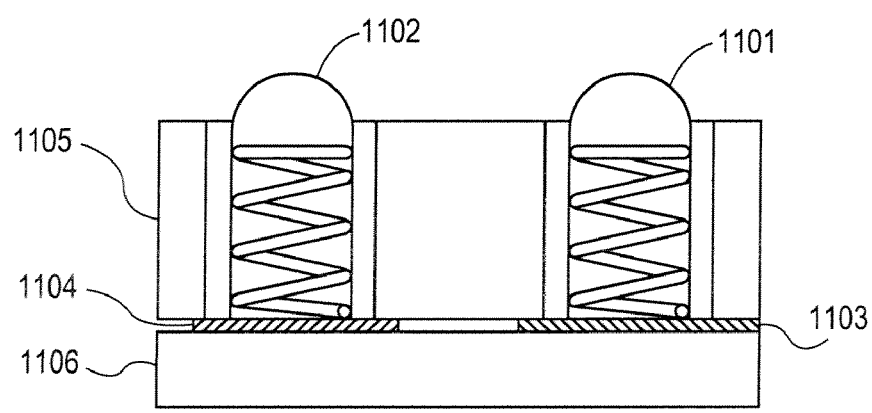
FIG. 11B illustrates a sectional view of FIG. 11A.

As noted above, spring-loaded test contacts may be used in lieu of printed test contacts in test element array 303. FIGS. 11A and 11B illustrate one embodiment of an array of test elements 1100 in a multi-layer printed circuit board (PCB) incorporating a spring-loaded signal contact 1101 and a spring-loaded ground contact 1102 in one layer 1105 of the multi-layer PCB. On another layer 1106 of the multi-layer PCB, internal printed contact 1103 provides a path for signal currents and internal printed contact 1104 provides a path for ground currents.

In one embodiment, when the m×n array of RFID straps 302 has been coupled to the m×n array of test elements 303, signal sources 307-1 through 307-m may be time-division multiplexed to the m×n array of RFID straps by 1×n switching matrices 306-1 through 306-m. Each switching matrix may be dedicated to one of the m columns of n RFID straps. FIG. 12 illustrates an m×n array corresponding to an array of test elements 303 (where m and n are assumed to be even numbers for convenience). As illustrated in FIG. 12, column 1 may be tested at frequency f1, column 2 may be tested at frequency if, and so on through column m tested at frequency fm. A time division multiplexing table may control the order of testing RFID straps in each column. In one embodiment, illustrated in FIG. 12, odd numbered columns may have one test order and even numbered columns may have another test order. Testing of odd numbered columns may start at the top of the column and proceed sequentially to the bottom of the column. Testing of even numbered columns may begin at the middle of the columns, proceed sequentially to the bottom of the column and continue from the top of the column to the middle. Thus, the RFID straps under test in any two adjacent columns will always be at least n/2 positions apart to maximize isolation and minimize crosstalk.

Frequencies f1 through fm may be chosen to maximize the frequency separation of nearest columns and next nearest columns in a specified operating frequency band. For example, the standard North American RFID band spans 62 channels of 400 MHz from 902 MHz to 928 MHz. FIG. 13 is a table illustrating the selection of channels to achieve maximum separation from first and second nearest neighbors for the case of m=19. The solution may not be unique for a given number of columns and number of channels, but that there will always be an optimum solution based on a minimum channel separation of first and second nearest neighbors. For example, in the solution set illustrated in FIG. 13, the channel separation between any two closest neighbors is never less than 18 channels and the channel separation between any two second closest neighbors is never less than 13 channels. Maximizing isolation between RFID straps under test is important because the test power incident on each RFID device may be 60 to 80 dB higher than the return signal from the device. So if one device happens to be responding to a reader when another reader is transmitting to a nearby device, cross talk can be a problem if the isolation is less than the difference between the incident and return signals.

Using a multiplexed testing method, such as the method described above, m RFID straps may be tested simultaneously over n test periods to completely test an m×n array of RFID straps. RFID straps may be tested for both RF sensitivity and programmability during a test period. In one embodiment, the RF signal of each RF signal source may be cycled through two or more power levels where an RFID strap is expected to be programmable. The programming data may be, for example, an identification code for the RFID strap, a lot and/or date code, a manufacturing code that identifies the position of the RFID strap on the sheet or roll, the test results for the RFID strap or any combination thereof. If the RFID strap is successfully programmed, the RFID strap may respond, for example, by transmitting a confirmation code or by retransmitting the programmed information.

If the programmability of the RFID strap is confirmed, the power level of the RF signal source (e.g., one of RF signal sources 307-1 through 307-i) may be reduced to two or more lower power levels that correspond to a specified sensitivity for RFID interrogation signals. If the RFID strap responds to the interrogation signals, the test system processor 313 may record the test results in a database in memory 314. The test results may include the programmability and interrogation signal levels, location codes and/or simple pass/fail flags. If the RFID strap does not respond to both the programming signals and the interrogation signals, the RFID strap's location may be recorded in the database with a failed flag. In one embodiment, marking device 315 may use the database in memory 314 to mark defective RFID straps when their associated array 302 is transported to the marking device as part of the aforementioned roll-to-roll test process.

Figure 14:
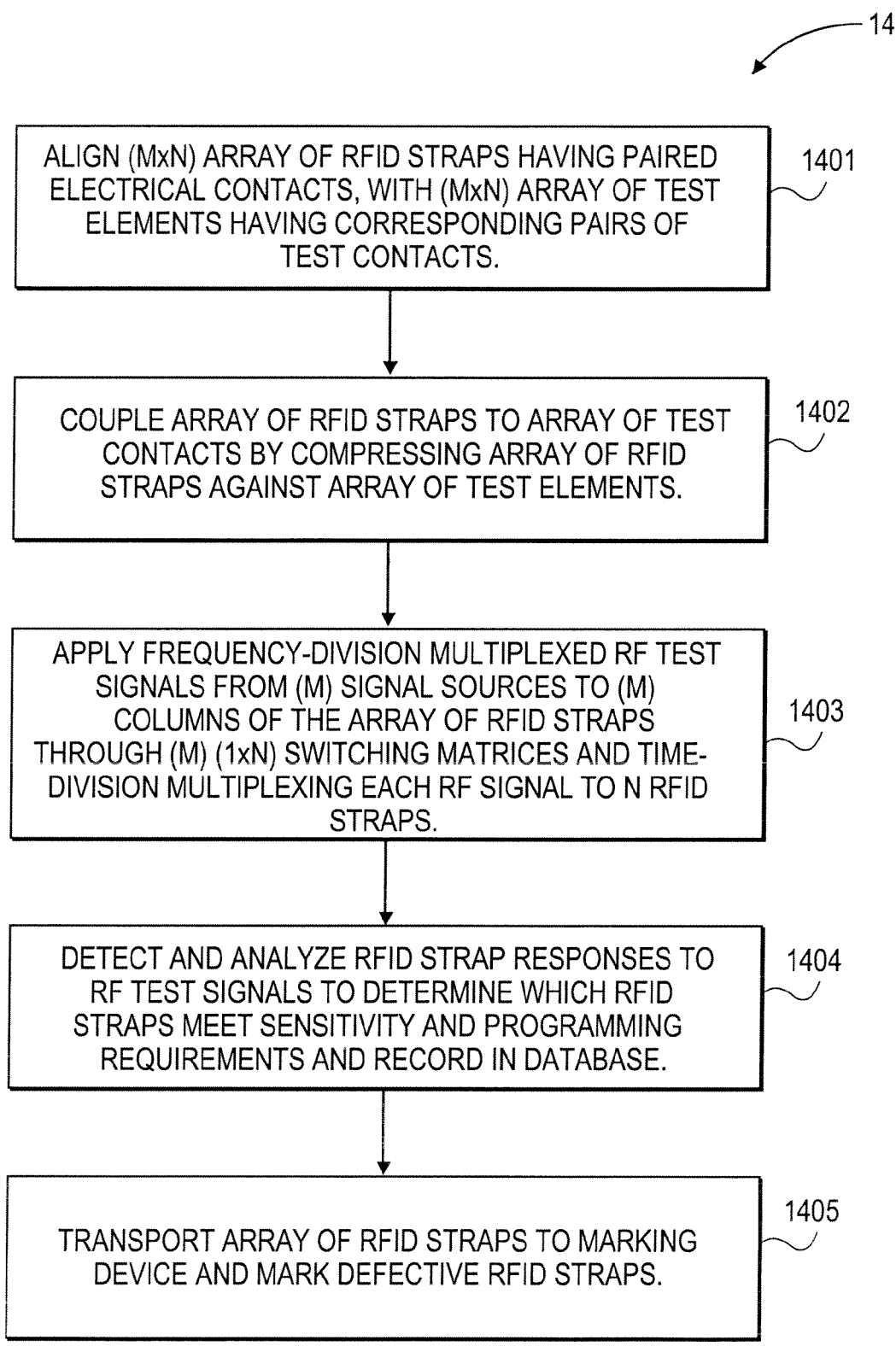
FIG. 14 illustrates a method in one embodiment of testing RFID straps.

With reference to FIG. 3, FIG. 14 illustrates one embodiment of a method 1400 for testing RFID straps. In the exemplary embodiment, an (m×n) array of RFID straps 302 having paired contacts is aligned with an (m×n) array of test elements 303 having corresponding paired test contacts (step 1401). The array of RFID straps is coupled to the array of test elements by compressing the array of RFID straps against the array of test elements (step 1402). RF signals from (m) frequency-division multiplexed signal sources 307-1 through 307-m are applied to the m columns of the array of RFID straps through (1×n) switching matrices 306-1 through 306-m, and each signal source is time-division multiplexed to the n RFID straps in its corresponding column (step 1403). RFID strap responses to the test signals are detected by the RE signal sources and analyzed to determine which RFID straps meet both programming and sensitivity specifications, and the results recorded in a database in memory 314 (step 1404). Finally, the array of RFID straps is transported to a marking device 315, where RFID straps not meeting the programming and sensitivity specifications are marked as defective (step 1405).

It will be apparent from the foregoing description that aspects of the present invention may be embodied, at least in part, in software. That is, the techniques may be carried out in a computer system or other data processing system in response to its processor, such as processor 313, executing sequences of instructions contained in a memory, such as memory 314. In various embodiments, hardwired circuitry may be used in combination with software instructions to implement the present invention. Thus, the techniques are not limited to any specific combination of hardware circuitry and software, nor to any particular source for the instructions executed by the data processing system.

A machine-readable medium can be used to store software and data which when executed by a data processing system causes the system to perform various methods of the present invention. This executable software and data may be stored in various places including, for example, memory 314 or mass storage device 316.

Thus, a machine-readable medium includes any mechanism that provides (i.e., stores and/or transmits) information in a form accessible by a machine (e.g., a computer, network device, personal digital assistant, manufacturing tool, any device with a set of one or more processors, etc.). For example, a machine-readable medium includes recordable/non-recordable media (e.g., read only memory (ROM); random access memory (RAM); magnetic disk storage media; optical storage media; flash memory devices; etc.), as well as electrical, optical, acoustical or other forms of propagated signals (e.g., carrier waves, infrared signals, digital signals, etc.); etc.

In the foregoing description, numerous specific details are set forth such as examples of specific components, devices, methods, etc., in order to provide a thorough understanding of embodiments of the present invention. It will be apparent, however, to one skilled in the art that these specific details need not be employed to practice embodiments of the present invention. In other instances, well-known materials or methods have not been described in detail in order to avoid unnecessarily obscuring embodiments of the present invention. It should be noted that the term "coupled" as used herein, may mean directly coupled or indirectly coupled through one or more intervening components. The invention has been described, herein, with reference to specific exemplary embodiments thereof. For example, switching matrices and RF signal sources have been described as being configured in columns, but they may be configured in rows in alternative embodiments. It will be evident that various modifications may be made thereto without departing from the broader spirit and scope of the invention as set forth in the claims. The specification and drawings are, accordingly, to be regarded in an illustrative sense rather than a restrictive sense.

What is claimed is:

1. A method for testing radio frequency identification (RFID) straps, comprising:
   coupling an RFID tester to an array of RFID straps;
   multiplexing a plurality of test signals to test the array of RFID straps; and
   detecting a plurality of return signals from the array of RFID straps, wherein the array of RFID straps comprises a plurality of lines of RFID straps, wherein each line is coupled to one of a plurality of test signals via a switching matrix, and wherein multiplexing the plurality of test signals comprises:
   frequency-division-multiplexing the plurality of test signals to the plurality of lines of RFID straps; and
   time-division-multiplexing each test signal to a corresponding line of RFID straps.

2. The method of claim 1, wherein each RFID strap in the array of RFID straps comprises:
   an RFID chip laminated in a roll material, the roll material comprising a first surface and a second surface; and
   a pair of contacts on the first surface of the roll material, coupled to the RFID chip, the array of RFID straps comprising an array of paired contacts on the first surface of the roll material.

3. The method of claim 2, wherein coupling the RFID tester to the array of RFID straps comprises:
   aligning the array of paired contacts with an array of paired test elements in the RFID tester; and
   compressing the array of RFID straps against the array of paired test elements.

4. The method of claim 3, wherein compressing the array of RFID straps against the array of paired test elements comprises compressing the first surface of the roll material against the array of paired test elements to directly couple the array of paired contacts with the array of paired test elements.

5. The method of claim 4, further comprising matching a source impedance of each test signal to a load impedance of a corresponding RFID strap.

6. The method of claim 3, wherein compressing the array of RFID straps against the array of paired test elements comprises compressing the second surface of the roll material against the array of paired test elements to capacitively couple the array of paired contacts with the array of paired test elements.

7. The method of claim 3, wherein the roll material is compressed against the array of paired test elements by a pressure plate having a compressible foam layer.

8. The method of claim 3, wherein the roll material is compressed against the array of paired test elements by a pressure plate having an inflatable bladder.

9. The method of claim 3, wherein the array of paired test elements comprises a patterned layer of a printed circuit board.

10. The method of claim 9, wherein the array of paired test elements comprises a symmetrical array configured to compensate for a functional asymmetry in the RFID chip.

11. The method of claim 3, wherein the array of paired test elements comprises an array of spring-loaded test contacts.

12. The method of claim 2, wherein the array of RFID straps is one of a plurality of arrays of RFID straps on the roll material, and wherein testing the plurality of arrays is part of a roll-to-roll testing process.

13. The method of claim 1, further comprising:
transmitting a first test signal of the plurality of test signals at a first frequency to test a first line of the array of RFID straps; and
transmitting a second test signal of the plurality of test signals at a second frequency to test a second line of the array of RFID straps.

14. The method of claim 13, wherein the first line and the second line are columns of the array of RFID straps.

15. The method of claim 14, wherein the first line and the second line are rows of the array of RFID straps.

16. The method of claim 1, wherein multiplexing the plurality of test signals further comprises stepping through a plurality of signal levels to test at least one of a sensitivity threshold of each RFID strap, a programmability threshold of each RFID strap, and a maximum power threshold of each RFID strap.

17. The method of claim 16, further comprising programming each RFID strap with one or more of an identification code, a lot code, a date code, a location code, or test results for the RFID strap.

18. The method of claim 16, further comprising marking RFID straps to identify RFID straps that do not meet a sensitivity specification and a programmability specification.

19. The method of claim 1, wherein detecting the plurality of return signals from the array of RFID straps comprises at least one of:
reading a manufacturing code from each of the RFID straps;
reading a programmed test code from each of the RFID straps; and
reading an array location code from each of the RFID straps.

20. The method of claim 1, further comprising recording test results for each RFID strap in a database, the database comprising at least one of pass-fail data and performance data.

21. An apparatus for testing arrays of RFID straps, comprising:
an array of paired test elements comprising a plurality of lines of paired test elements;
a plurality of RFID readers to transmit RFID signals and to receive RFID responses;
a plurality of switching matrices, each switching matrix coupled to one of the plurality of RFID readers and to one of the plurality of lines, to switch a plurality of RFID signals to the array of paired test elements; and
a compression plate to compress an array of RFID straps against the array of paired test elements and to couple the array of RFID straps to the array of paired test elements, wherein each RFID reader is configured to operate at a different frequency, and wherein each RFID reader is time-division-multiplexed to a plurality of paired test elements in a corresponding line of the array of paired test elements.

22. The apparatus of claim 21, wherein each RFID strap in the array of RFID straps comprises:
an RFID chip laminated in a roll material, the roll material comprising a first surface and a second surface; and
a pair of contacts on the first surface of the roll material, coupled to the RFID chip, the array of RFID straps comprising an array of paired contacts on the first surface of the roll material.

23. The apparatus of claim 22, wherein the first surface of the roll material is compressed against the array of paired test elements to directly couple the array of paired test elements with the array of RFID straps.

24. The apparatus of claim 23, further comprising a matching network, coupled between each pair of test elements and a corresponding switching matrix, to match a source impedance of a signal source to a load impedance of a corresponding RFID strap.

25. The apparatus of claim 22, wherein the second surface of the roll material is compressed against the array of paired test elements to capacitively couple the array of paired test elements with the array of RFID straps.

26. The apparatus of claim 21, further comprising an imaging device to align the array of RFID straps with the array of test elements.

27. The apparatus of claim 21, wherein the array of paired test elements comprises a patterned layer of a printed circuit board (PCB).

28. The apparatus of claim 27, wherein the array of paired test elements comprises a symmetrical array configured to compensate for a functional asymmetry in the RFID chip.

29. The apparatus of claim 21, wherein the array of paired test elements comprises an array of spring-loaded test contacts.

30. The apparatus of claim 21, wherein each of the RFID readers is configured to step through a plurality of signal levels to test at least one of a sensitivity threshold of an RFID strap and a programmability threshold of an RFID strap.

31. The apparatus of claim 21, further comprising a marking device to mark RFID straps that do not meet one or more of a sensitivity specification and a programmability specification.

32. The apparatus of claim 21, wherein the array of RFID straps comprises one of a plurality of arrays of RFID straps on the roll material, and wherein testing the arrays of RFID straps is part of a roll-to-roll test process, further comprising:
a controller to control the alignment, coupling and testing of the arrays of RFID straps;
a processor, coupled with the controller, to process data and execute instructions;
at least one of a memory device and a mass storage device, coupled with the processor, to store data and instructions.

33. The apparatus of claim 32, wherein the processor is configured to record test data for each RFID strap in an array of RFID straps, the test data comprising at least one of a manufacturing code, an array location code, a pass-fail code and test data.

34. The apparatus of claim 21, wherein the compression plate includes one of a compressible foam layer and an inflatable bladder.

35. A machine-readable medium containing instructions which when executed on a data processing system causes the system to perform a method for testing RFID straps, the method comprising:
coupling an RFID tester to an array of RFID straps, the array of RFID straps comprising a plurality of columns of RFID straps, each column comprising a plurality of RFID straps;
multiplexing a plurality of test signals to test the array of RFID straps; and
detecting a plurality of return signals from the array of RFID straps, wherein the RFID tester comprises a plurality of lines of test elements, each line of test elements comprising a plurality of test elements, wherein each line is coupled to a test signal via a switching matrix, and wherein multiplexing the plurality of test signals comprises:
frequency-division-multiplexing the plurality of test signals to the plurality of lines of test elements; and time-division-multiplexing each test signal to the plurality of test elements in each line.

36. The machine readable medium of claim 35, wherein each RFID strap in the array of RFID straps comprises:
an RFID chip laminated in a roll material, the roll material comprising a first surface and a second surface; and
a pair of electrical contacts on the first surface of the roll material, coupled to the RFID chip.

37. The machine-readable medium of claim 36, wherein coupling the RFID tester to the array of RFID straps comprises:
aligning the array of paired contacts with an array of paired test elements in the RFID tester; and
compressing the array of RFID straps against the array of paired test elements to couple the array of paired test elements with the array of paired contacts.

38. The machine-readable medium of claim 37, wherein compressing the array of RFID straps against the array of paired test elements comprises compressing the first surface of the roll material against the array of paired test elements to directly couple the array of RFID straps with the array of paired test elements.

39. The machine-readable medium of claim 37, wherein compressing the array of RFID straps against the array of paired test elements comprises compressing the second surface of the roll material against the array of paired test elements to capacitively couple the array of RFID straps with the array of paired test elements.

40. The machine-readable medium of claim 35, wherein multiplexing the plurality of test signals further comprises stepping through a plurality of signal levels to test at least one of a sensitivity threshold of each RFID strap and a programmability threshold of each RFID strap.

41. The machine-readable medium of claim 40, further comprising programming each RFID strap with one or more of an identification code, a lot code, a date code, a location code, or test results for the RFID strap.

42. The machine-readable medium of claim 40, further comprising marking RFID straps to identify RFID straps that do not meet one or more of a sensitivity specification and programmability specification.

43. The machine readable medium of claim 35, wherein the array of RFID straps is one of a plurality of arrays of RFID straps on the roll material, and wherein testing the plurality of arrays is part of a roll-to-roll testing process.

44. The machine readable medium of claim 35, wherein detecting the plurality of return signals from the array of RFID straps comprises at least one of:
reading a manufacturing code from each of the RFID straps;
reading a programmed test code from each of the RFID straps; and
reading an array location code from each of the RFID straps.

45. The machine readable medium of claim 35, the method further comprising recording test results for each RFID strap in a database, the database comprising at least one of pass-fail data and performance data.

* * * * *